United States Patent
Sakong et al.

(10) Patent No.: US 7,973,303 B2
(45) Date of Patent: Jul. 5, 2011

(54) NITRIDE SEMICONDUCTOR DEVICE

(75) Inventors: Tan Sakong, Suwon (KR); Youn Joon Sung, Yongin (KR); Jeong Wook Lee, Yongin (KR)

(73) Assignee: Samsung Led Co., Ltd., Suwon, Gyunggi-do (KR)

( * ) Notice: Subject to any disclaimer, the term of this patent is extended or adjusted under 35 U.S.C. 154(b) by 103 days.

(21) Appl. No.: 12/580,152

(22) Filed: Oct. 15, 2009

(65) Prior Publication Data

US 2010/0155699 A1    Jun. 24, 2010

(30) Foreign Application Priority Data

Dec. 19, 2008    (KR) .................. 10-2008-0130075

(51) Int. Cl.
*H01L 29/15* (2006.01)
(52) U.S. Cl. ......... 257/14; 257/11; 257/12; 257/E51.01; 438/2; 438/46; 438/47

(58) Field of Classification Search .............. 257/11–27, 257/E51.01; 438/2, 46–47, E21.371
See application file for complete search history.

(56) References Cited

U.S. PATENT DOCUMENTS 6,635,904 B2    10/2003    Goetz et al.

FOREIGN PATENT DOCUMENTS

KR    10-2001-0034578 A    4/2001

*Primary Examiner* — Thanh V Pham
*Assistant Examiner* — Mark A Laurnzi, III
(74) *Attorney, Agent, or Firm* — McDermott Will & Emery LLP

(57) ABSTRACT

A nitride semiconductor device includes n-type and p-type nitride semiconductor layers, an active layer, the active layer having a lamination of quantum barrier layers and quantum well layers, a thermal stress control layer disposed between the n-type nitride semiconductor layer and the active layer, and formed of a material having a smaller thermal expansion coefficient than the n-type and p-type nitride semiconductor layers, and a lattice stress control layer disposed between the thermal stress control layer and the active layer, and including a first layer and a second layer.

11 Claims, 4 Drawing Sheets

NITRIDE SEMICONDUCTOR DEVICE

CROSS-REFERENCE TO RELATED APPLICATIONS

This application claims the priority of Korean Patent Application No. 10-2008-0130075 filed on Dec. 19, 2008, in the Korean Intellectual Property Office, the disclosure of which is incorporated herein by reference.

BACKGROUND OF THE INVENTION

1. Field of the Invention

The present invention relates to a nitride semiconductor device, and more particularly, to a nitride semiconductor device capable of enhancing light emission efficiency by alleviating thermal stress and lattice stress acting on an active layer.

2. Description of the Related Art

Nitride semiconductors are broadly utilized for green or blue light emitting diodes (LEDs) or laser diodes (LDs), which serve as the light sources of, for example, full-color displays, image scanners, various signal systems and optical communications devices. The nitride semiconductor devices may be provided as light emitting devices including active layers that emit light of various colors, such as blue and green, by electron-hole recombination.

Since the development of nitride semiconductor devices, technical advancements to broaden their application ranges have been made. Thus, many studies are being conducted to determine how to utilize nitride semiconductor devices in general lighting apparatuses and electrical lighting sources. According to the related art, nitride light emitting devices have been used as components employed in low-current, low output mobile products. However, of late, the application ranges of nitride light emitting devices have been broadened to the field of high-current, high-output products. This has led to a need to enhance light emission efficiency by improving the quality of nitride semiconductor crystals and the like.

SUMMARY OF THE INVENTION

An aspect of the present invention provides a nitride semiconductor device capable of enhancing light emission efficiency by alleviating thermal stress and lattice sterns acting on an active layer.

According to an aspect of the present invention, there is provided a nitride semiconductor device including: n-type and p-type nitride semiconductor layers; an active layer disposed between the n-type and p-type nitride semiconductor layers, the active layer having a lamination of quantum barrier layers and quantum well layers alternated with each other; a thermal stress control layer disposed between the n-type nitride semiconductor layer and the active layer, and formed of a material having a smaller thermal expansion coefficient than the n-type and p-type nitride semiconductor layers; and a lattice stress control layer disposed between the thermal stress control layer and the active layer, and including a first layer and a second layer, wherein the first is formed of a material having a band gap energy which is less than that of the thermal stress control layer and greater than that of the quantum well layer, and has a pit in a top surface thereof, and the second layer is formed of a different material from the first layer, and is disposed between the first layer and the active layer, filling the pit.

The thermal stress control layer may be formed of $Al_{x1}In_{y1}Ga_{(1-x1)}N$ where $0<x1\leq1$ and $0\leq y1\leq0.01$. The n-type and p-type nitride semiconductor layers may be formed of GaN.

The thermal stress control layer may include a third layer formed of $Al_{x1}In_{y1}Ga_{(1-x1)}N$ where $0<x1\leq1$ and $0\leq y1\leq0.01$, and a fourth layer disposed between the third layer and the lattice stress control layer and formed of a different material from the third layer. In this case, the fourth layer may be formed of $Al_{x2}Ga_{(1-x2)}N$ where $0\leq x2<1$.

The thermal stress control layer may have a thickness of 100 nm or more.

The first layer is formed of $Al_{x3}In_{y3}Ga_{(1-x3-y3)}N$ where $0\leq x3<1$ and $0<y3<1$. In this case, the second layer may be formed of $Al_{x4}In_{y4}Ga_{(1-x4-y4)}N$ where $0\leq x4<1$ and $0\leq y4<y3$. The first layer may have an In content smaller than that of the quantum well layer.

The pit may be formed by removing a defective portion of the first layer.

The first layer may have a thickness of 20 nm or more.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
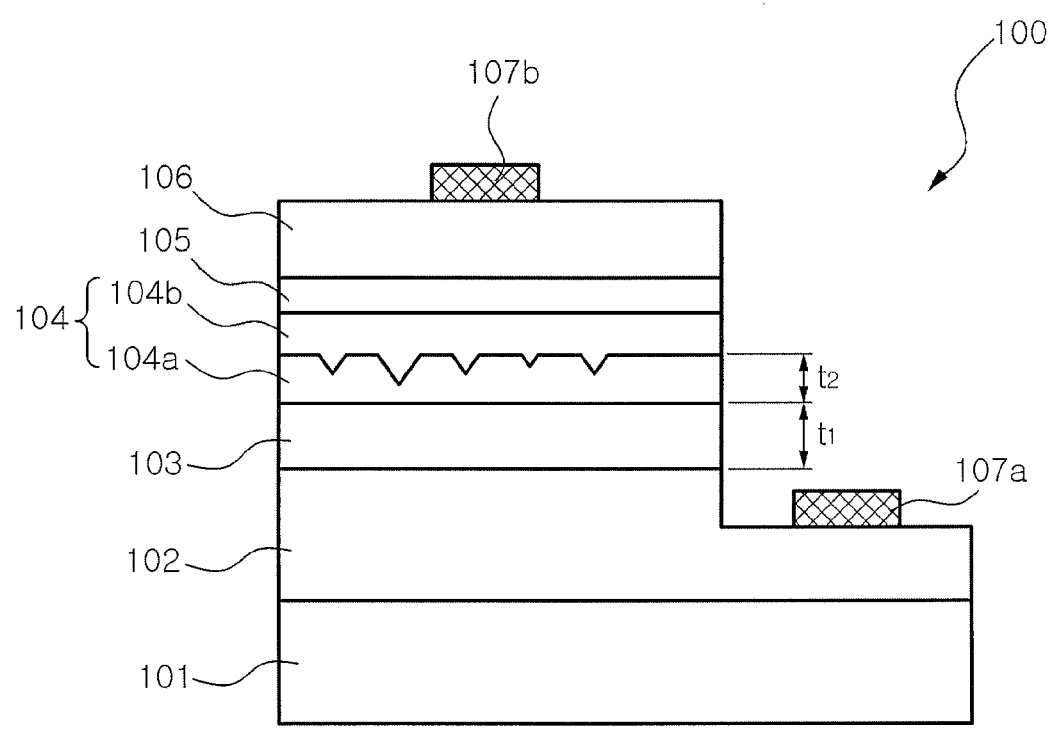
FIG. 1 is a cross-sectional view of a nitride semiconductor device according to an exemplary embodiment of the present invention.

Exemplary embodiments of the present invention will now be described in detail with reference to the accompanying drawings.

The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and like reference numerals in the drawings denote like elements, and thus their description will be omitted.

Figure 2:
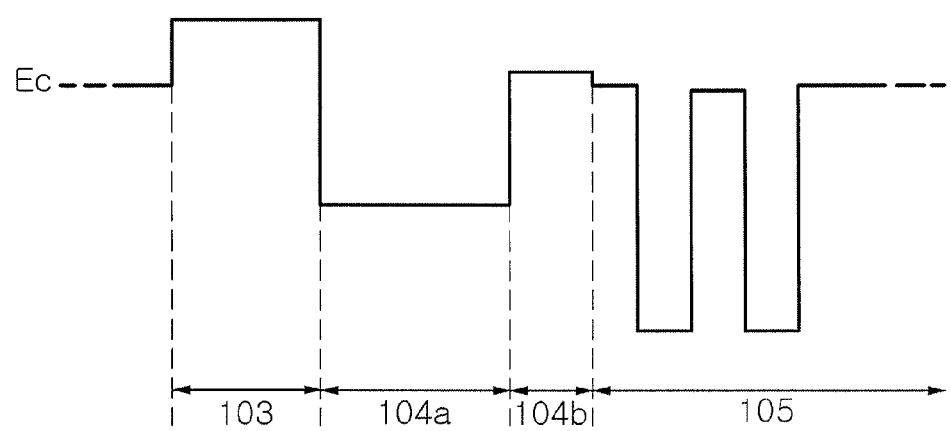
FIG. 2 illustrates the conduction band energy level of layers in the structure of FIG. 1, including a thermal stress control layer and a lattice stress control layer.

FIG. 1 is a cross-sectional view of a nitride semiconductor device according to an exemplary embodiment of the present invention. FIG. 2 illustrates the conduction band energy levels of layers illustrated in FIG. 1, including a thermal stress control layer and a lattice stress control layer. Referring to FIG. 1, a nitride semiconductor device 100, according to this embodiment, includes a substrate 101, an n-type nitride semiconductor layer 102, a thermal stress control layer 103, a lattice stress control layer 104, an active layer 105, and a p-type nitride semiconductor layer 106. An n-type electrode 107a may be disposed on the exposed surface of the n-type nitride semiconductor layer 102, and a p-type electrode 107b may be disposed on the top surface of the p-type nitride semiconductor layer 106. In this case, an ohmic contact layer (not shown), formed of a transparent electrode material, may be disposed between the p-type nitride semiconductor layer 106 and the p-type electrode 107b. In this embodiment, a horizontal nitride semiconductor device structure is illustrated in which the n-type and p-type electrodes 107a and 107b are disposed in the same direction. However, the present invention is not limited thereto, and may be used for a vertical nitride semiconductor device as will be described later. In the vertical nitride semiconductor device, a sapphire substrate may be removed.

The substrate 101 is provided as a substrate for growing a single nitride crystal, and a sapphire substrate may be used in general. The sapphire substrate is a crystal body having Hexa-Rhombo (Hexa-Rhombo R3c) symmetry. The sapphire substrate has a lattice constant of 13.001 Å in c-axis orientation, and a lattice constant of 4.765 Å in a-axis orientation, and has a C-plane (0001), an A-plane (1120) and an R-plane (1102). The C-plane of this sapphire substrate allows a nitride film to be grown thereupon relatively easily, and is stable even at high temperatures, thus it is predominantly utilized as a substrate for nitride growth. Of course, a substrate may be formed of Si, SiC, GaN, ZnO, $MgAl_2O_4$, MgO, $LiAlO_2$ or $LiGaO_2$ according to shape. Moreover, a buffer layer, for example, an un-doped GaN layer may be grown to improve the quality of the nitride-based semiconductor single crystal grown on the substrate 101.

The n-type and p-type nitride semiconductor layers 102 and 106 may be formed of n-doped and p-doped semiconductor materials represented by $Al_xIn_yGa_{(1-x-y)}N$ where $0 \leq x \leq 1$, $0 \leq y \leq 1$, and $0 \leq x+y \leq 1$. Representative examples of the semiconductor material include GaN, AlGaN and InGaN. The n-type impurities may utilize Si, Ge, Se and Te, and the p-type impurities may utilize Mg, Zn and Be. The n-type and p-type nitride semiconductor layers 102 and 106 may be grown by use of a known process such as metal-organic chemical vapor deposition (MOCVD) or hydride vapor phase epitaxy (HVPE).

The active layer 105 is disposed between the n-type and p-type nitride semiconductor layers 102 and 106 and emits light with a predetermined energy by electron-hole recombination. As can be seen from the graph of FIG. 2 depicting energy levels, the active layer 105 may have a multiple quantum well (MQW) structure in which quantum well layers and quantum barrier layers are alternately laminated. As for the MQW structure, a structure of InGaN/GaN may be used in general.

The thermal stress control layer 103 serves to reduce stress caused by variations in the thermal expansion coefficient (CTE) and acting on a nitride semiconductor layer grown on the thermal stress control layer 103, particularly, on the active layer 105. To this end, the thermal stress control layer 103 may be formed of a material having a smaller CTE than the n-type and p-type nitride semiconductor layers 102 and 106. If the n-type and p-type nitride semiconductor layers 102 and 106, and the quantum barrier layers of the active layer 105 are formed of GaN, the thermal stress control layer 103 may be formed of a material represented by $Al_{x1}In_{y1}Ga_{(1-x1)}N$ where $0 < x1 \leq 1$ and $0 \leq y1 \leq 0.01$. A nitride semiconductor layer containing Al has a smaller CTE than GaN, thereby reducing the extent to which GaN expands or contracts due to variations in temperature.

In more detail, a GaN film, grown on a substrate such as a sapphire substrate, is curved concavely due to tensile stress as its thickness increases. On the contrary, the GaN film is curved convexly at temperatures lower than the growth temperature of GaN, due to compressive stress. If the thermal stress control layer 103 formed of a material with a lower CTE than the GaN film is used as in this embodiment, then tensile stress acts on the growing active layer 105, thereby minimizing influences of the variations in temperature, that is, the curving of the GaN film. To perform such alleviation of thermal stress, the thermal stress control layer 103 may have a thickness $t_1$ of about 100 nm or more. In the case of the vertical nitride semiconductor device of FIG. 6, a thermal stress control layer may apply compressive stress to an active layer after a substrate serving to grow a nitride single crystal is removed.

Figure 3:
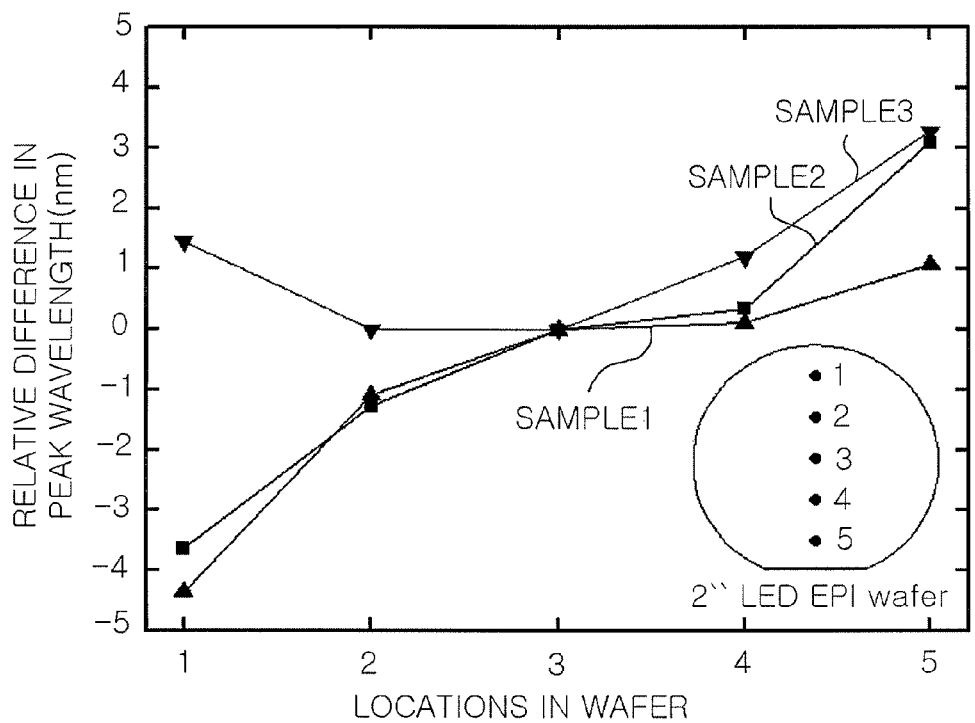
FIG. 3 is a graph depicting variations in wavelength distribution at predetermined locations in a wafer according to an embodiment of the present invention and comparative examples of the related art.

The alleviation of thermal stress may allow light of a uniform wavelength to be emitted over the entire active layer 105 and enhance crystalline properties. FIG. 3 is a graph depicting variations in wavelength distribution over locations in a wafer according to the embodiment of the present invention and comparative examples of the related art. Sample 1 in FIG. 3 represents a general LED structure including none of thermal stress and lattice stress control layers, sample 2 represents an LED structure employing just a lattice stress control layer, and sample 3 represents an LED structure employing the structure of FIG. 1, that is, both the thermal stress and lattice stress control layers. As for an InGaN film constituting a quantum well layer, the composition of the InGaN film varies according to the temperature of a growth plane. Thus, the extent to which the active layer 105 is curved may be estimated based on differences in an emission wavelength at each spot. It can be seen from FIG. 3 that the LED structure employing the thermal stress control layer as in this embodiment ensures uniform light emission over the entire emission plane since the curving of a nitride film is minimized.

As described above, the thermal stress control layer 103 may serve to alleviate the thermal stress applied to the active layer 105. However, when being formed of a material containing Al, the thermal stress control layer 103 disposed under the active layer 105 may cause stress due to a difference in the lattice constant therebetween. To reduce this stress, this embodiment employs the lattice stress control layer 104 between the thermal stress control layer 103 and the active layer 105. The lattice stress control layer 104 serves to reduce a difference in the lattice constant between the thermal stress control layer 103 and the active layer 105. To this end, the lattice stress control layer 104 may be formed of a material having a band gap energy which is less than that of the thermal stress control layer 103 and greater than that of the quantum well layers of the active layer 105. For example, the lattice stress control layer 104 may be formed of $Alx_3In_{y3}Ga_{(1-x3-y3)}N$ where $0 \leq x3 < 1$ and $0 < y3 < 1$ and have a smaller In content than that in the quantum well layer of the active layer 105. This allows a smaller difference in the lattice constant with the active layer 105 than that between the active layer 105 and the thermal stress control layer 103.

In this case, the lattice stress control layer 104 may include a first layer 104a and a second layer 104b. The first layer 104a may be formed of $Al_{x3}In_{y3}Ga_{(1-x3-y3)}N$ where $0 \leq x3 < 1$ and $0 < y3 < 1$ and have a thickness $t_2$ of about 20 nm in order to alleviate lattice stress. However, due to an increase in In content, the crystalline properties of the first layer 104a may be undermined in a portion around a threading dislocation. Accordingly, as shown in FIG. 1, pits are formed in the top surface of the first layer 104a by removing a portion where crystalline defects, such as threading dislocations, occur. The pits may be formed by etching the top surface of the first layer 104. In this case, defective portions may be removed first to form pits.

The etching process may be performed successively with the process of growing a nitride semiconductor in an in-situ process. To this end, a reaction chamber may be situated in an atmosphere of a gas such as $H_2$, $N_2$ or $NH_3$ or a combination thereof. This in-situ process may favorably affect process efficiency since a growing epi-structure does not need to be moved to the outside of the reaction chamber. The second layer 104b is disposed on the first layer 104a, filling the pits. To this end, the second layer 104b has a different composition from the first layer 104a, and has high crystalline properties. For example, the second layer 104b may be formed of $Al_{x4}In_{y4}Ga_{(1-x4-y4)}N$ where $0 \leq x4 < 1$ and $0 \leq y4 < y3$. The use of the second layer 104b having superior crystalline properties on the defect-removed portion may suppress current leakage, thereby enhancing light emission efficiency.

Figure 4:
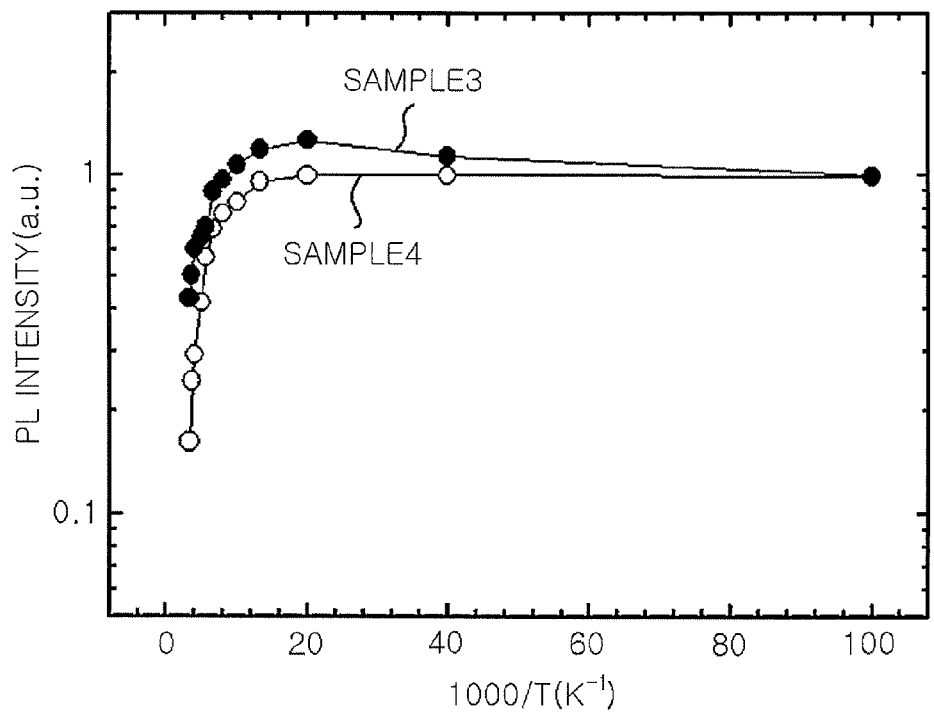
FIG. 4 shows photoluminescence (PL) intensity depending on whether or not a lattice stress control layer is employed.

FIG. 4 illustrates the intensity of photoluminescence (PL) depending on whether or not a lattice stress control layer is used. Sample 3 of FIG. 4 is identical to sample 3 of FIG. 3, and sample 4 represents a structure including just the thermal stress control layer without the lattice stress control layer. It can be seen from FIG. 4 that the use of both the thermal stress control layer and the lattice stress control layer enhances light emission efficiency.

Figure 5:
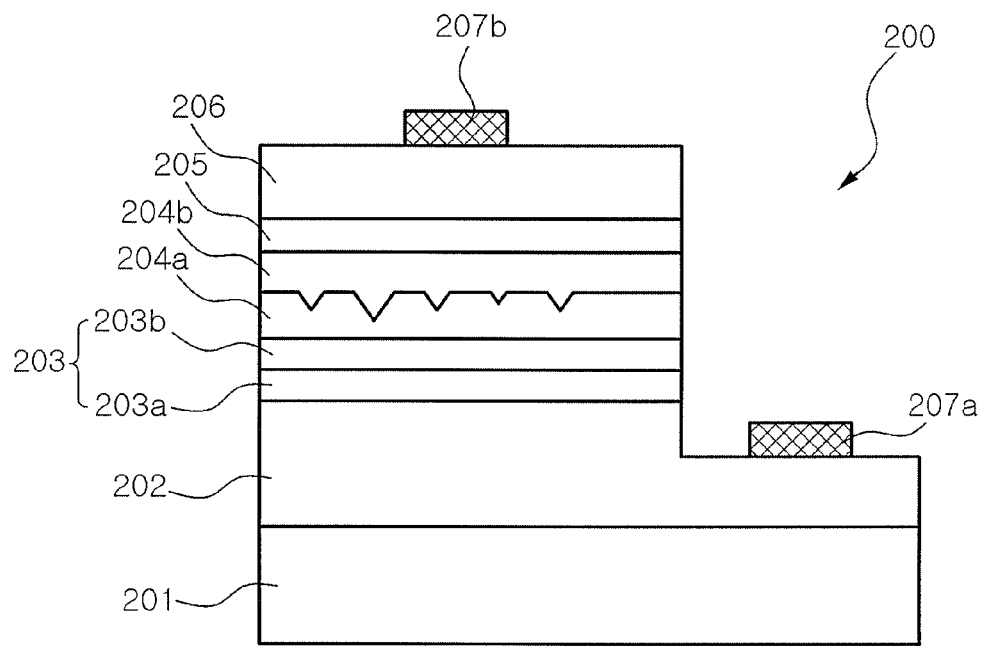
FIG. 5 is a cross-sectional view of a nitride semiconductor device according to another exemplary embodiment of the present invention.

FIG. 5 is a cross-sectional view of nitride semiconductor device according to another exemplary embodiment of the present invention. As in the embodiment of FIG. 1, a nitride semiconductor device 200 according to this embodiment includes a substrate 201, an n-type nitride semiconductor layer 202, a thermal stress control layer 203, a lattice stress control layer 204, an active layer 205, and a p-type nitride semiconductor layer 206. An n-type electrode 107a and a p-type electrode 107b are formed on the exposed surface of the n-type nitride semiconductor layer 102 and the top surface of the p-type nitride semiconductor layer 106, respectively. This embodiment of FIG. 5 is different from the previous embodiment in that the thermal stress control layer 203 includes two layers. That is, as shown in FIG. 5, the thermal stress control layer 203 includes a third layer 203a and a fourth layer 203b. Like the thermal stress control layer of FIG. 1, the third layer 203a may be formed of $Al_{x1}In_{y1}Ga_{(1-x1)}N$ where $0 < x1 \leq 1$ and $0 \leq y1 \leq 0.01$. The fourth layer 203b may be formed of a different material from the third layer 203a, for example, $Al_{x2}Ga_{(1-x2)}N$ where $0 \leq x2 < 1$.

The fourth layer 203b may be disposed between the third layer 203a serving to alleviate thermal stress and the lattice stress control layer 204, so that it can alleviate any stress generated between the two layers. For example, in the case that the active layer 205 has a structure that emits light in a green wavelength range, a big difference in stress occurs between the lattice stress control layer 204 and the thermal stress control layer, that is, the third layer 203a, without the fourth layer 203b. This may degrade the crystalline quality of the lattice stress control layer 204. Therefore, the fourth layer 203b formed of $Al_{x2}Ga_{(1-x2)}N$ where $0 \leq x2 < 1$ is used as a part of the thermal stress control layer 203, so that the crystalline quality of the lattice stress control layer 204 can be maintained.

As for the above embodiments, horizontal semiconductor devices are described in which n-type and p-type electrodes are disposed in the same direction. However, the present invention is not limited thereto, and may be applied to a vertical semiconductor device. That is, as in an embodiment illustrated in FIG. 6, a semiconductor light emitting device 300 has a vertical electrode structure in which electrodes of opposite polarities are oppositely disposed. The semiconductor light emitting device 300 includes an n-type nitride semiconductor layer 302, a thermal stress control layer 303, a lattice stress control layer 304, an active layer 305, a p-type nitride semiconductor layer 306, and a conductive substrate 307. Here, the lattice stress control layer 304 includes first and second layers 304a and 304b, and the thermal stress control layer 303 includes third and fourth layers 303a and 303b. In this case, a substrate for the growth of a semiconductor single crystal is removed by a laser lift-off process or the like, and an n-type electrode 308 is dispose on the exposed surface of the n-type semiconductor layer 302 after the removal process. Like terms may be understood as being designated for like elements throughout embodiments. Thus, a description will be made only about the conductive substrate 307.

The conductive substrate 307 serves as both a p-type electrode and a support, which supports a light emission structure, that is, the n-type nitride semiconductor layer 302, the thermal stress control layer 303, the lattice stress control layer 304, the active layer 305 and the p-type nitride semiconductor layer 306 in the laser lift-off process or the like. In this case, the conductive substrate 307 may be formed of a material such as Si, Cu, Ni, Au, W or Ti. The conductive substrate 307 may be formed by plating, bonding or the like according to a selected material. A reflective metal layer (not shown) for an ohmic contact and light reflection may be interposed between the p-type nitride semiconductor layer 306 and the conductive layer 307.

Figure 6:
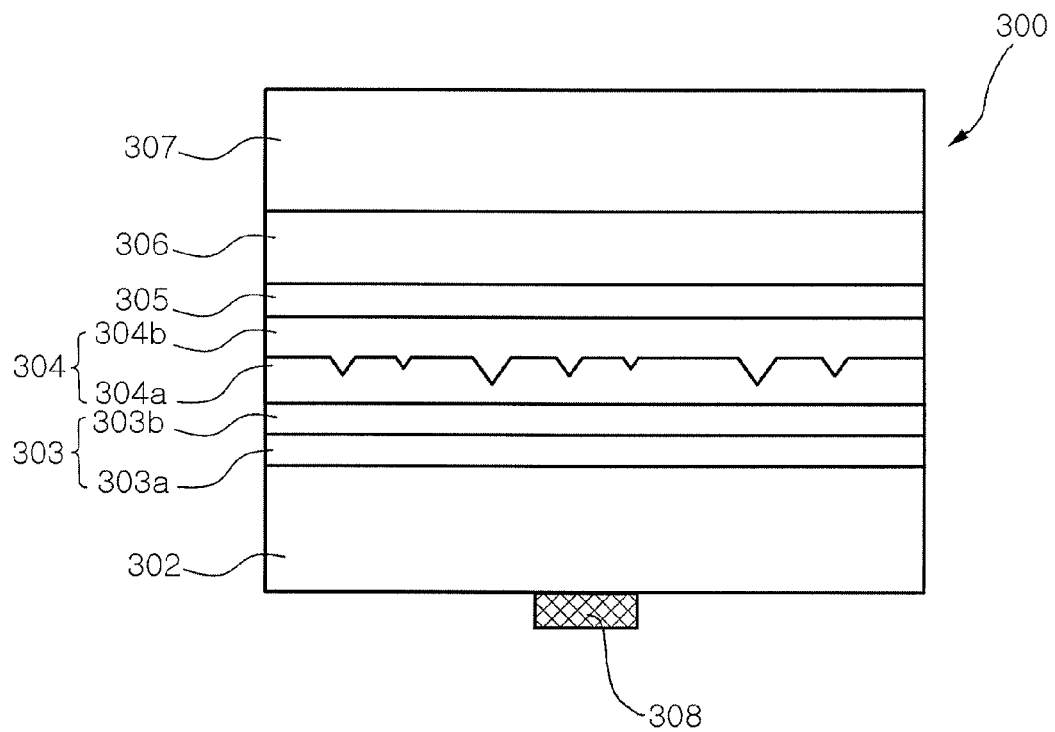
FIG. 6 is a cross-sectional view of a nitride semiconductor device according to another exemplary embodiment of the present invention.
Figure 7:
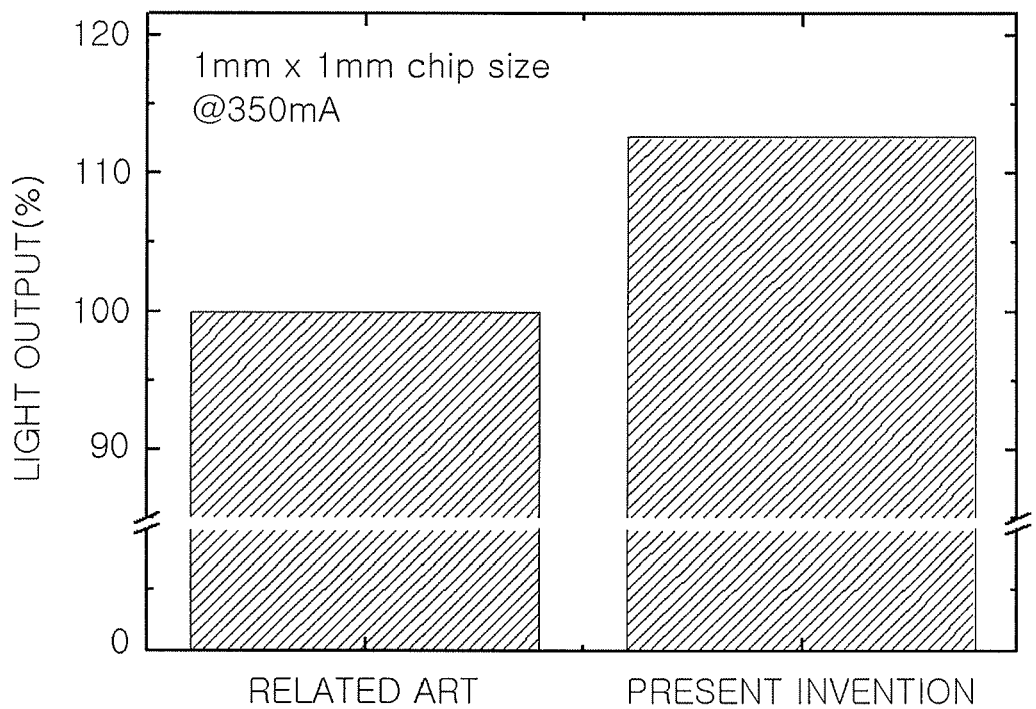
FIGS. 7 and 8 are graphs depicting the quantity of light and the characteristic of reverse bias of a vertical nitride semiconductor device of FIG. 6 respectively, in comparison with the related art.
Figure 8:
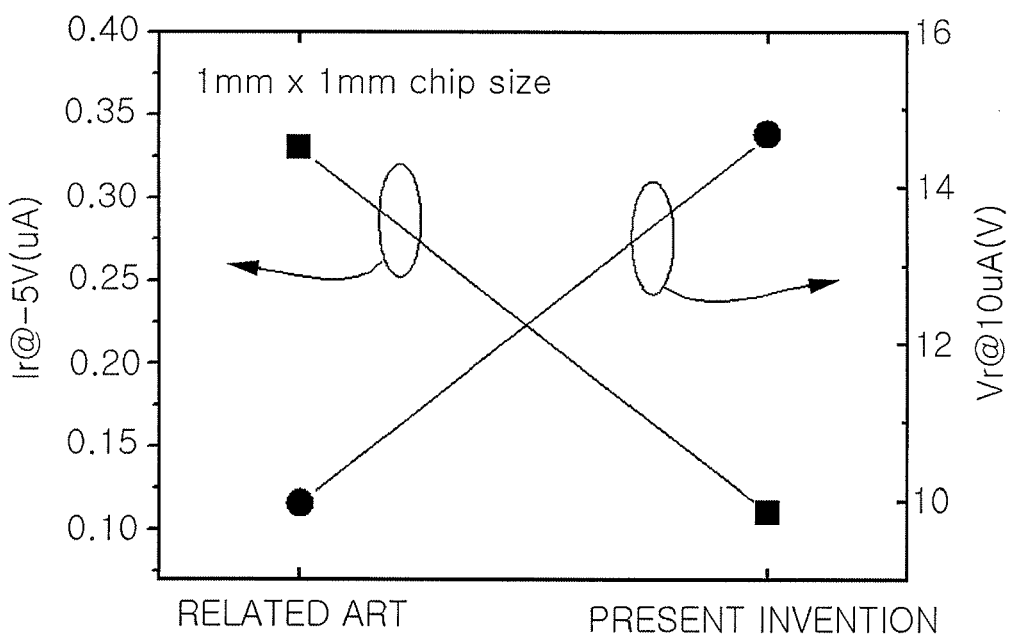

FIGS. 7 and 8 are graphs depicting the emission quantity and reverse-bias characteristics of the vertical nitride semiconductor device of FIG. 6 respectively, in comparison with the related art. Specifically, the structure according to the present invention is a vertical nitride semiconductor device having 1 mm×1 mm chip size, and the structure of the related art corresponds to the structure of FIG. 6, excluding the thermal stress control layer and the lattice stress control layer. Referring to FIG. 7, the structure of the present invention has emission characteristics improved by about 12% as compared to the related art structure. Referring to FIG. 8, the structure of the present invention realizes the superior characteristics of reverse bias to the related art structure.

As set forth above, according to exemplary embodiments of the invention, a nitride semiconductor device realizes enhanced emission efficiency by alleviating thermal stress and lattice stress acting on the active layer.

While the present invention has been shown and described in connection with the exemplary embodiments, it will be apparent to those skilled in the art that modifications and variations can be made without departing from the spirit and scope of the invention as defined by the appended claims.

What is claimed is:
1. A nitride semiconductor device comprising:
   n-type and p-type nitride semiconductor layers;
   an active layer disposed between the n-type and p-type nitride semiconductor layers, the active layer having a lamination of quantum barrier layers and quantum well layers alternated with each other;
   a thermal stress control layer disposed between the n-type nitride semiconductor layer and the active layer, and formed of a material having a smaller thermal expansion coefficient than the n-type and p-type nitride semiconductor layers; and a lattice stress control layer disposed between the thermal stress control layer and the active layer, and including a first layer and a second layer, wherein the first layer is formed of a material having a band gap energy which is less than that of the thermal stress control layer and greater than that of the quantum well layer, and has a pit in a top surface thereof, and the second layer is formed of a different material from the first layer, and is disposed between the first layer and the active layer, filling the pit.

2. The nitride semiconductor device of claim 1, wherein the thermal stress control layer is formed of $Al_{x1}In_{y1}Ga_{(1-x1)}N$ where $0<x1\leq1$ and $0\leq y1\leq0.01$.

3. The nitride semiconductor device of claim 2, wherein the n-type and p-type nitride semiconductor layers are formed of GaN.

4. The nitride semiconductor device of claim 1, wherein the thermal stress control layer includes a third layer formed of $Al_{x1}In_{y1}Ga_{(1-x1)}N$ where $0<x1\leq1$ and $0\leq y1\leq0.01$, and a fourth layer disposed between the third layer and the lattice stress control layer and formed of a different material from the third layer.

5. The nitride semiconductor device of claim 4, wherein the fourth layer is formed of $Al_{x2}Ga_{(1-x2)}N$ where $0\leq x2<1$.

6. The nitride semiconductor device of claim 1, wherein the thermal stress control layer has a thickness of 100 nm or more.

7. The nitride semiconductor device of claim 1, wherein the first layer is formed of $Al_{x3}In_{y3}Ga_{(1-x3-y3)}N$ where $0\leq x3<1$ and $0<y3<1$.

8. The nitride semiconductor device of claim 7, wherein the second layer is formed of $Al_{x4}In_{y4}Ga_{(1-x4-y4)}N$ where $0\leq x4<1$ and $0\leq y4<y3$.

9. The nitride semiconductor device of claim 7, wherein the first layer has an In content smaller than that of the quantum well layer.

10. The nitride semiconductor device of claim 1, wherein the pit is formed by removing a defective portion of the first layer.

11. The nitride semiconductor device of claim 1, wherein the first layer has a thickness of 20 nm or more.

* * * * *